United States Patent
Lin

(10) Patent No.: US 8,279,600 B2
(45) Date of Patent: Oct. 2, 2012

(54) ELECTRONIC DEVICE ENCLOSURE WITH ANTI-EMI HOLES

(75) Inventor: Yu-Hsu Lin, Santa Clara, CA (US)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 224 days.

(21) Appl. No.: 12/909,044

(22) Filed: Oct. 21, 2010

(65) Prior Publication Data
US 2011/0304977 A1 Dec. 15, 2011

(30) Foreign Application Priority Data
Jun. 15, 2010 (CN) .......................... 2010 1 0200942

(51) Int. Cl.
*H05K 7/20* (2006.01)
*H05K 9/00* (2006.01)

(52) U.S. Cl. ......... 361/690; 361/695; 361/719; 361/818

(58) Field of Classification Search ........................ None
See application file for complete search history.

(56) References Cited

U.S. PATENT DOCUMENTS

| | | | | |
|---|---|---|---|---|
| 4,932,755 A * | 6/1990 | Holdridge et al. | ............ | 359/896 |
| 6,610,922 B1 * | 8/2003 | Twiss et al. | .................... | 174/390 |
| 6,671,186 B2 * | 12/2003 | Kopf | ............................ | 361/818 |
| 6,947,294 B2 * | 9/2005 | Lin et al. | ........................ | 361/818 |
| 7,492,610 B2 * | 2/2009 | Gilliland | ........................ | 361/818 |
| 7,495,181 B2 * | 2/2009 | Matsushita et al. | ........... | 174/377 |
| 7,733,646 B2 * | 6/2010 | Hisatsune | ..................... | 361/690 |
| 2007/0257337 A1 * | 11/2007 | Yanase et al. | .................. | 257/659 |

* cited by examiner

*Primary Examiner* — Boris Chervinsky
(74) *Attorney, Agent, or Firm* — Altis Law Group, Inc.

(57) ABSTRACT

An electronic device enclosure for suppressing Electro-Magnetic Interference (EMI) includes a first plate defined on a first plane, a second plate defined on a second plane and a number of polygonal holes defined in the first plate at an angle of orientation. The second plane is substantially perpendicular to the first plane. The angle of orientation of the number of polygonal holes in the first plate is set according to a number of maximum dimensions in a direction substantially perpendicular to the second plane. The angle of orientation is defined such that there are a minimum number of maximum dimensions.

8 Claims, 7 Drawing Sheets

ELECTRONIC DEVICE ENCLOSURE WITH ANTI-EMI HOLES

BACKGROUND

1. Technical Field

The disclosure generally relates to an electronic device enclosure, especially to an electronic device enclosure with anti-EMI holes for suppressing Electro-Magnetic Interference (EMI).

2. Description of Related Art

Electromagnetic interference (or EMI, also called radio frequency interference or RFI) is a disturbance that affects an electrical circuit due to either electromagnetic conduction or electromagnetic radiation emitted from an external source. The disturbance may interrupt, obstruct, or otherwise degrade or limit the effective performance of the circuit. The source may be any object, artificial or natural, that carries rapidly changing electrical currents, such as an electrical circuit in a computer. The computer enclosure usually includes a number of holes on a rear panel for heat dissipation. However, sometimes EMI may pass through, which may affect other electronic devices.

Therefore there is a need for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
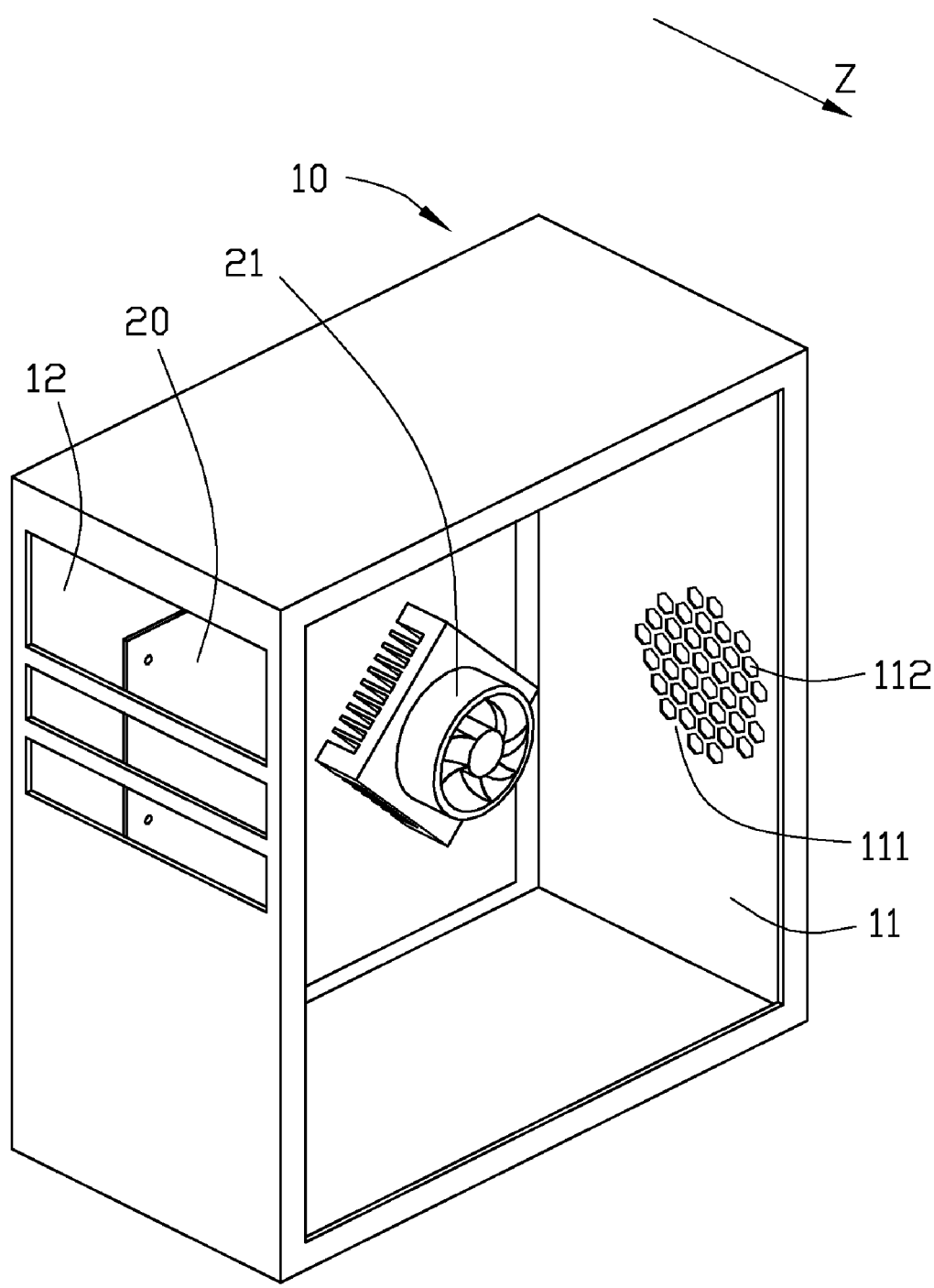
FIG. 1 is an isometric view of an embodiment of an electronic device enclosure with anti-EMI holes including a motherboard defining a motherboard plane.

Referring to FIG. 1, an electronic device enclosure 10 with anti-EMI holes includes a rear panel 11 and a side panel 12 substantially perpendicular to the rear panel 11. The rear panel 11 defines a number of anti-EMI holes 112 having the same angle of orientation. The side panel 12 has a motherboard 20 defining a motherboard plane thereon. A heat dissipation apparatus 21 is fixed on the motherboard 20. The rear panel 11 defines a ventilation area 111 thereon facing the heat dissipation apparatus 21, for heat exchange with outside the electronic device enclosure. The anti-EMI holes 112 are defined in the ventilation area 111.

Figure 2:
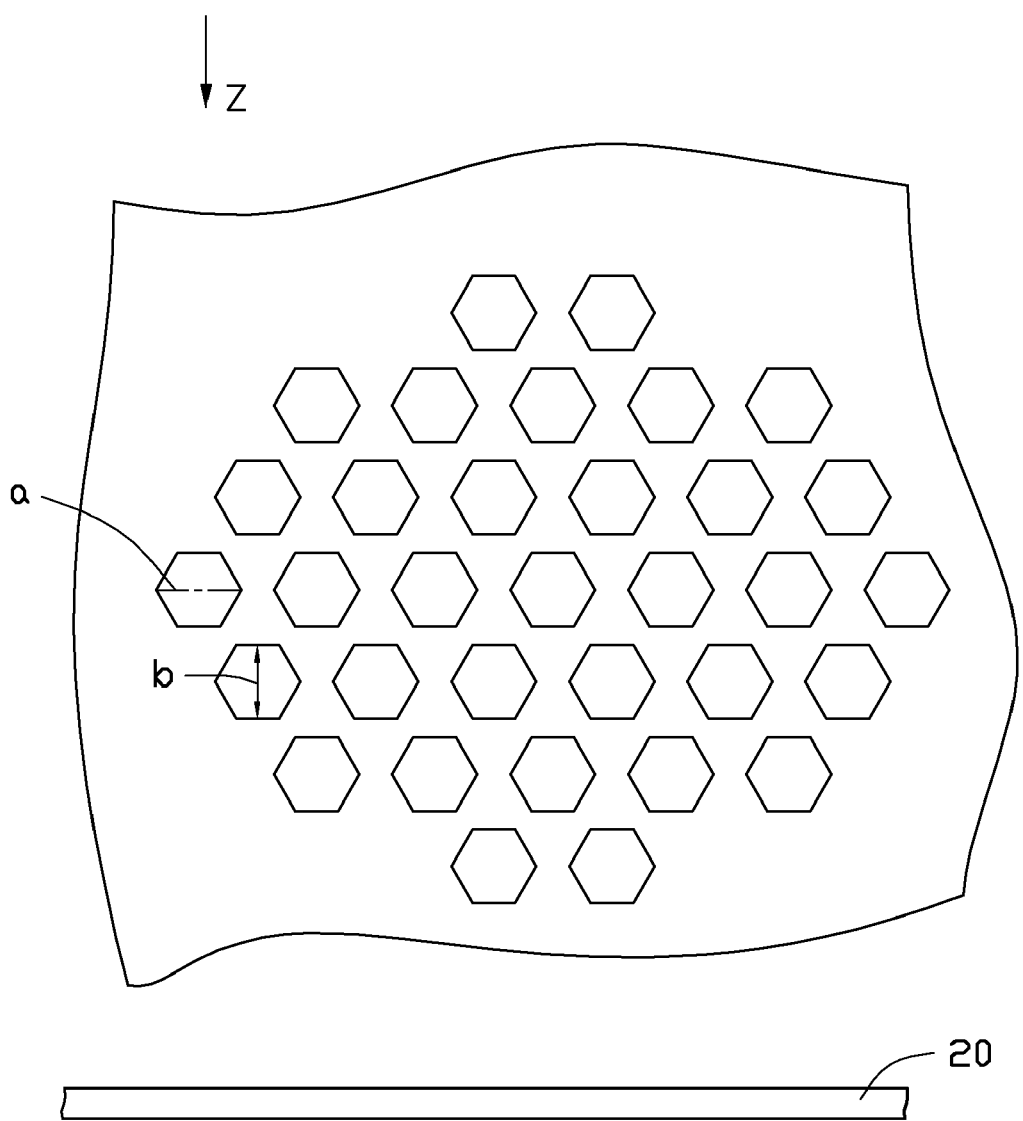
FIG. 2 is a partial enlarged view of the anti-EMI holes in the rear panel with the motherboard of FIG. 1, when a maximum diagonal of the holes is parallel to the motherboard plane.
Figure 3:
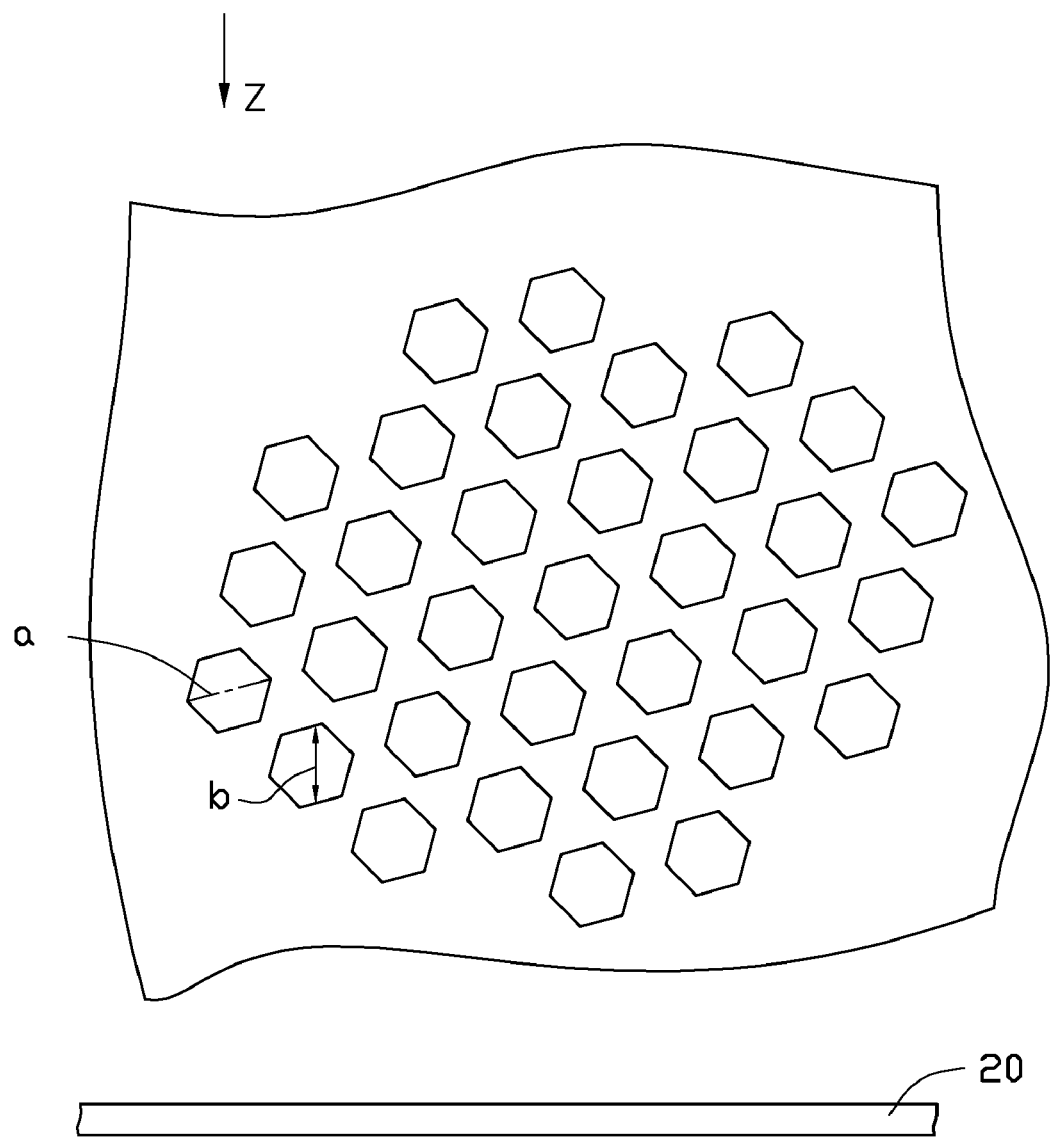
FIG. 3 is a partial enlarged view of the anti-EMI holes in the rear panel with the motherboard of FIG. 1, when an angle between the maximum diagonal and the motherboard plane is 15 degrees.
Figure 4:
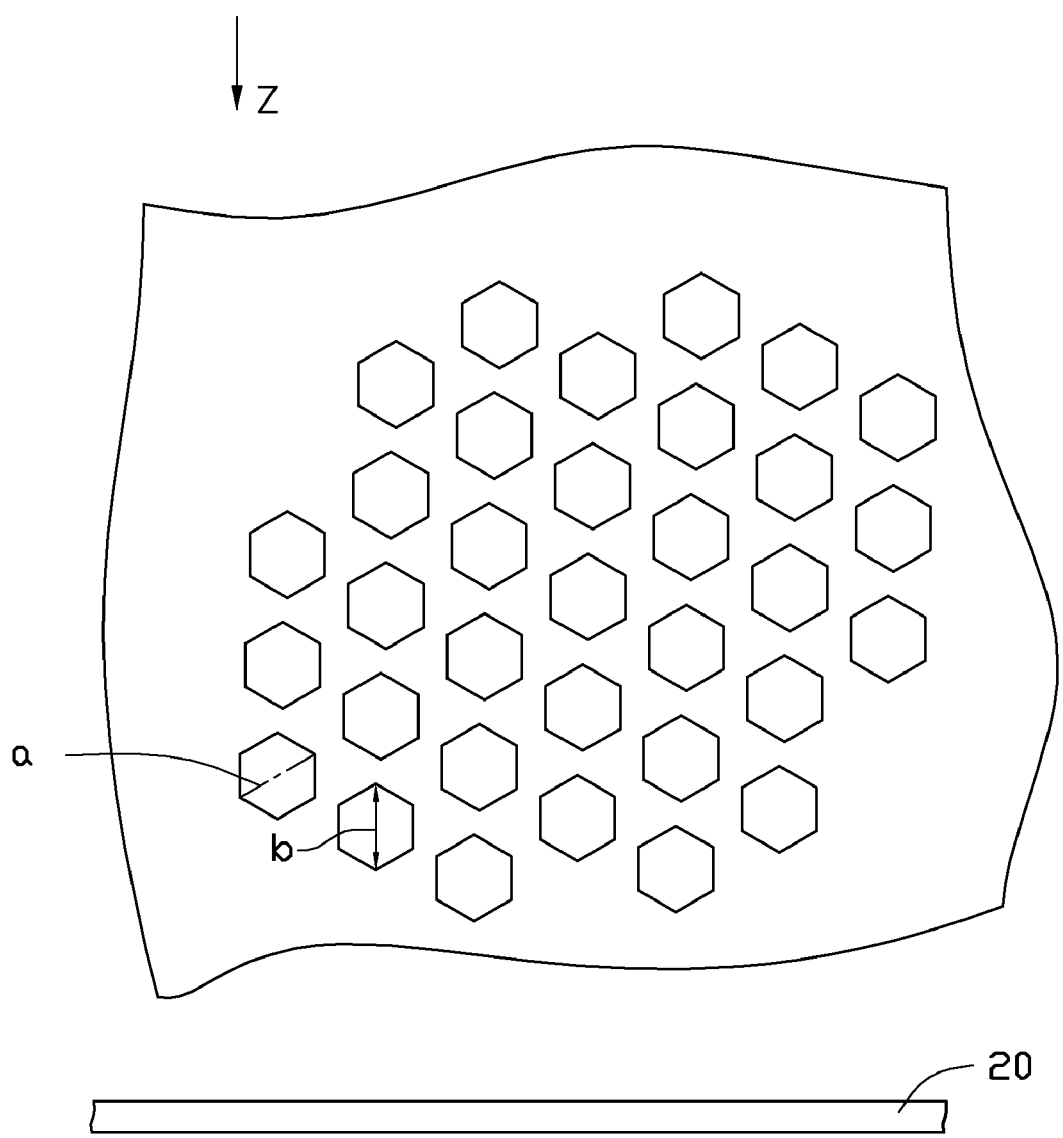
FIG. 4 is a partial enlarged view of the anti-EMI holes in the rear panel with the motherboard of FIG. 1, when an angle between the maximum diagonal and the motherboard plane is 30 degrees.
Figure 5:
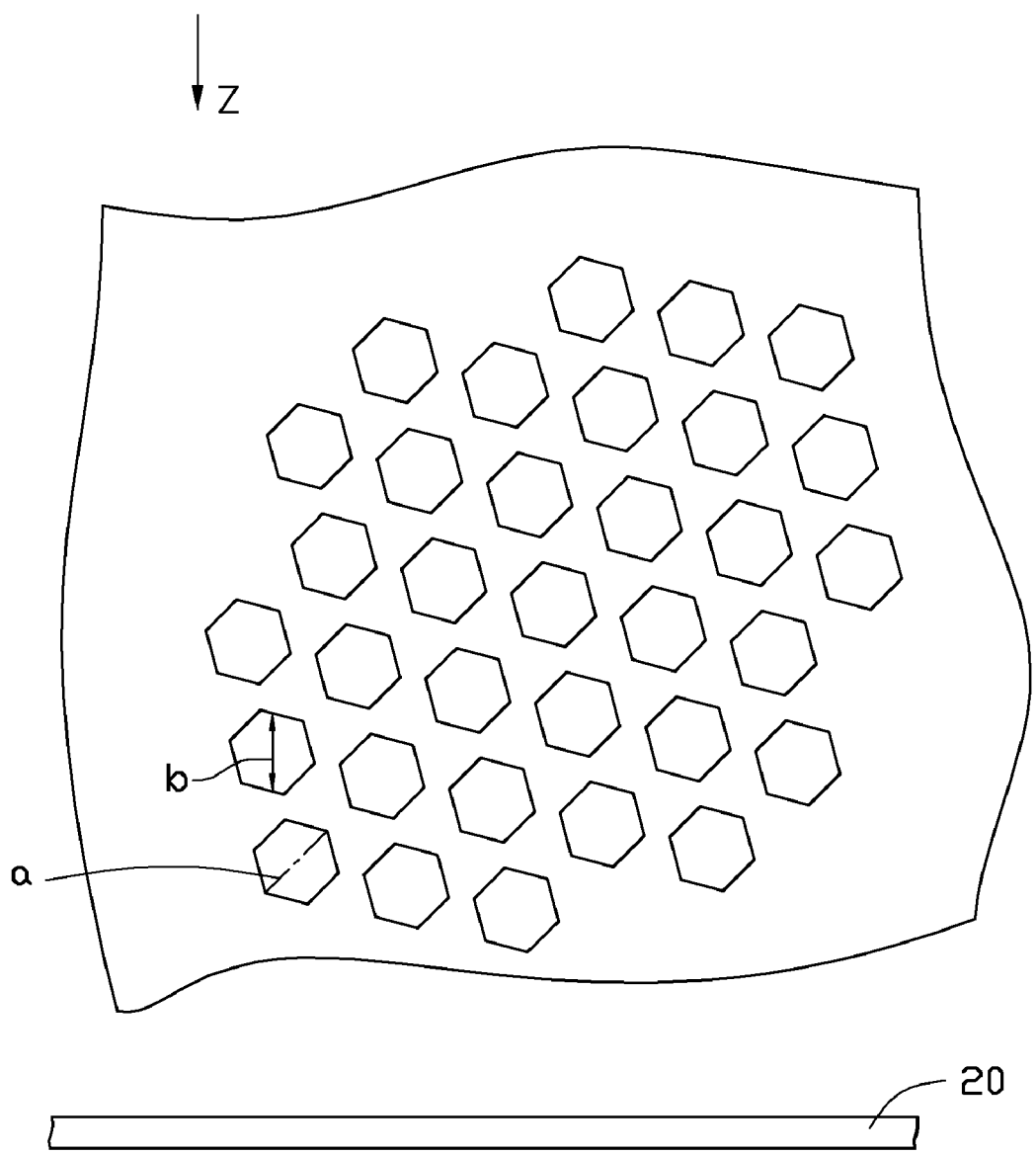
FIG. 5 is a partial enlarged view of the anti-EMI holes in the rear panel with the motherboard of FIG. 1, when an angle between the maximum diagonal and the motherboard plane is 45 degrees.
Figure 6:
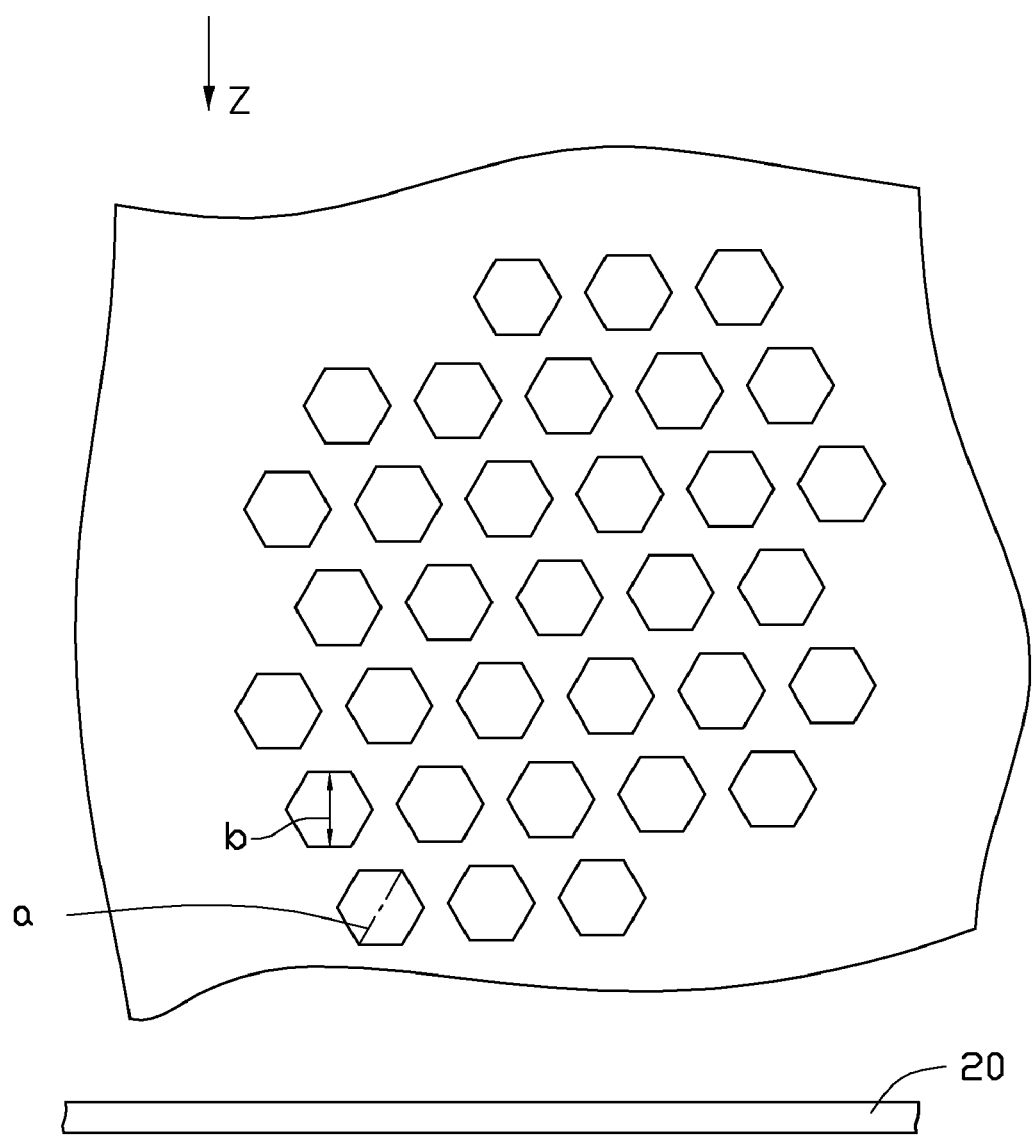
FIG. 6 is a partial enlarged view of the anti-EMI holes in the rear panel with the motherboard of FIG. 1, when an angle between the maximum diagonal and the motherboard plane is 60 degrees.
Figure 7:
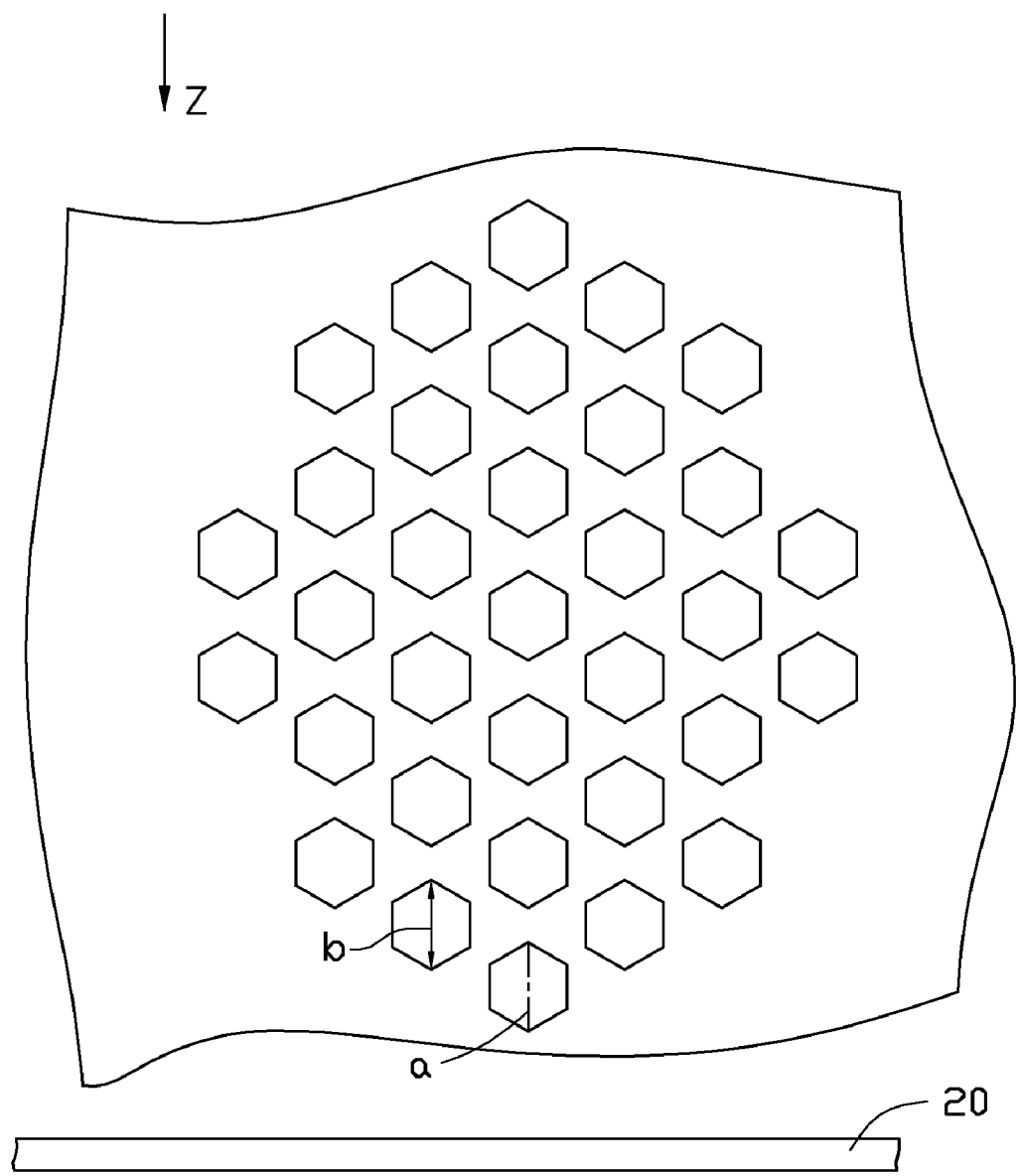
FIG. 7 is a partial enlarged view of the anti-EMI holes in the rear panel with the motherboard of FIG. 1, when an angle between the maximum diagonal and the motherboard plane is 90 degrees.

Referring to FIG. 2, in one embodiment, the anti-EMI holes 112 are regular hexagon holes. Each regular hexagon hole 112 has a maximum diagonal 'a' that extends in a direction substantially parallel to the motherboard plane. Each regular hexagon hole 112 has a maximum dimension 'b' in a Z direction substantially perpendicular to the motherboard plane. Each regular hexagon hole 112 includes a number of maximum dimensions 'b' in the Z direction respectively corresponding to different angles of orientation of the regular hexagon holes 112 in the rear panel 11 plane. When the maximum diagonal 'a' extends in a direction substantially parallel to the motherboard plane, the corresponding maximum dimension 'b' in the Z direction is the minimum of the number of maximum dimensions 'b'.

Referring to FIGS. 3~7, at different angles of orientation of the regular hexagon holes 112 in the rear panel 11 plane, an angle between the maximum diagonal 'a' extending direction and the second plane will be different, such as 15 degrees, 30 degrees, 45 degrees, 60 degrees, or 90 degrees. Each regular hexagon hole 112 in FIGS. 3~7 has a maximum dimension 'b' in the Z direction respectively. Using a software application called FLOEMC 6.1 to simulate the electric field status when the angles are different. The simulated conditions are set to: grid labels precision 0.8 mm×0.8 mm×0.8 mm (length×width×height) in 3D space. The simulation time is 200 ns. The simulation frequency is 1.5 GHZ. The radiation source model is a 3D antenna radiation source. The peak electric field voltage on a position 3m from the radiation source is indicated for different angles of orientation between the diagonal 'a' extending direction and second plane in the table below:

| Angle/Degrees | 0/60 | 15 | 30 | 45 | 90 |
|---|---|---|---|---|---|
| Peak electric field voltage (v/m) | $1.22e^{-4}$ | $1.25e^{-4}$ | $1.29e^{-4}$ | $1.24e^{-4}$ | $1.28e^{-4}$ |

The simulation according to the set conditions shows that when the angle between the maximum diagonal 'a' extending direction and the second plane is 0 degree or 60 degrees, i.e. the maximum diagonal 'a' extending direction is substantially parallel to the second plane, the peak electric field voltage on a position 3m from the radiation source is at a minimum. That is, the corresponding regular hexagon holes 112 have the best effect to suppress EMI. The maximum dimensions 'b' in the Z direction are measured at different angles. A ratio of the maximum dimensions 'b' for 0/60 degrees, 15/45 degrees, and 30/90 degree is 1.732:1.7932:2. That is, when the angle between the maximum diagonal 'a' extending direction and the second plane is 0 degree or 60 degrees, the corresponding maximum dimension 'b' in the Z direction is the minimum of the number of maximum dimensions 'b'. When the motherboard 20 has other daughter boards thereon, the angle between the maximum diagonal 'a' extending direction and the second plane can be an intermediate value, i.e. 15 degrees or 45 degrees.

The electronic device enclosure with anti-EMI holes of this embodiment is not limited to the rear panel 11 with regular hexagon holes 112. The anti-EMI holes 112 can also be other polygonal holes. When the anti-EMI holes 112 are other polygonal shapes, the anti-EMI holes 112 are defined in the rear panel 11 at an angle of orientation, at which the maximum dimension 'b' in the Z direction is the minimum of the number of maximum dimensions 'b'.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device enclosure for suppressing Electro-Magnetic Interference (EMI), comprising:
    a first plate defined on a first plane;
    a second plate defined on a second plane which is substantially perpendicular to the first plane; and
    a number of polygonal holes defined in the first plate at an angle of orientation, wherein the angle of orientation is set according to a number of maximum dimensions in a direction substantially perpendicular to the second plane; and the angle of orientation is defined such that there are a minimum number of maximum dimensions.

2. The electronic device enclosure of claim 1, wherein the number of polygonal holes are regular hexagon holes; and each regular hexagon hole has a maximum diagonal which extends in a direction substantially parallel to the second plane.

3. The electronic device enclosure of claim 1, wherein the second plate comprises a radiation source thereon; and the radiation source is a motherboard.

4. The electronic device enclosure of claim 3, wherein the motherboard has a heat dissipation apparatus thereon; the first plate defines a ventilation area thereon facing the heat dissipation apparatus for heat exchange with outside the electronic device enclosure; and the number of polygonal holes are defined in the ventilation area.

5. A method of disposing anti-EMI holes in an electronic device enclosure, the method comprises the following steps:
    providing a first panel on a first plane, wherein the first panel comprises a number of polygonal holes therein at an angle of orientation; and a second panel on a second plane which is substantially perpendicular to the first plane, wherein the second panel is capable of having a motherboard placed thereon; and
    determining the orientation of the number of polygonal holes in the first panel, wherein the angle of orientation is determined according to a number of maximum dimensions in a direction substantially perpendicular to the second plane; and the angle of orientation is defined such that there are a minimum number of maximum dimensions.

6. The method of claim 5, wherein the number of polygonal holes are regular hexagon holes; and each regular hexagon hole has a maximum diagonal which extends in a direction substantially parallel to the second plane.

7. The method of claim 5, wherein the motherboard has a heat dissipation apparatus thereon; the first panel defines a ventilation area thereon facing the heat dissipation apparatus for heat exchange with outside the electronic device enclosure; and the number of polygonal holes are defined in the ventilation area.

8. The method of claim 5, wherein the number of polygonal holes are regular hexagon holes; each regular hexagon hole has a maximum diagonal; and an angle between the maximum diagonal extending direction and the second plane is 15 degrees or 45 degrees.

* * * * *